United States Patent
Camporese et al.

(10) Patent No.: US 6,629,298 B1
(45) Date of Patent: Sep. 30, 2003

(54) AUTOMATED PROGRAMMABLE PROCESS AND METHOD FOR THE IMPROVEMENT OF ELECTRICAL DIGITAL SIGNAL TRANSITION RATES IN A VLSI DESIGN

(75) Inventors: Peter J. Camporese, Hopewell Junction, NY (US); Adam R. Jatkowski, Wappingers Falls, NY (US); Leon J. Sigal, Monsey, NY (US); Patrick M. Williams, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/437,844

(22) Filed: Nov. 10, 1999

(51) Int. Cl.$^7$ .................................................. G06F 9/45

(52) U.S. Cl. .............................................. 716/6; 716/5

(58) Field of Search ......................................... 716/5, 6

(56) References Cited

U.S. PATENT DOCUMENTS

| | | | | |
|---|---|---|---|---|
| 5,475,605 | A | * 12/1995 | Lin | 716/18 |
| 6,145,428 | A | * 11/2000 | Gold et al. | 244/17.13 |
| 6,189,131 | B1 | * 2/2001 | Graef et al. | 716/18 |
| 6,279,142 | B1 | * 8/2001 | Bowen et al. | 703/13 |
| 6,374,394 | B1 | * 4/2002 | Camporese et al. | 716/12 |

OTHER PUBLICATIONS

Stanka, A. et al., "Parasitic Extraction", 1996, Intel. pp. 6–33.*

Sean Carey et al. "CMOS Driver/buffer Delay Calculation & Interconnect Modeling for Short Channel Devices", IBM Poughkeepsie NY, S/390 Division, Dec. 15, 1995.

* cited by examiner

Primary Examiner—John F. Niebling
Assistant Examiner—Stacy A. Whitmore
(74) Attorney, Agent, or Firm—Lynn Augspurger; Cantor Colburn LLP

(57) ABSTRACT

A method (and a system for using the method) for automating a slew rate analysis between two or more circuits on a semiconductor chip. The method includes the steps of: receiving as input one or more input parameters characterizing the physical medium through which the signal propagation occurs (the net) and the electrical characteristics of signals transmitted between the circuits; and providing as output one or more output parameters characterizing the appropriate solution for physical implementation of the circuit(s) and net(s) which satisfy the performance requirements of the system. The receiving step can comprise any one of: providing a hierarchical signal name cross-reference defining a name for the signal for a given hierarchy level of the circuits; providing a set of one or more boolean equations used to generate the one or more output parameters from the one or more input parameters; providing a physical design information for the circuits; and providing a timing information for the signals. The boolean equations can include as input variables: the physical design information for the circuits; and the timing information for the signals. The transmitting step includes the steps of: determining if the signals require one or more buffers; determining if signal pin locations of the circuits through hierarchical levels thereof are not optimal; determining if strengths of transistors driving the signals must be increased; determining if the widths of wires used to transmit the signals must be increased; and determining if wires used to transmit the signals must be on less resistive wiring layers.

16 Claims, 4 Drawing Sheets

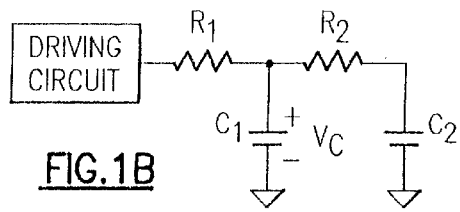
FIG.1A  FIG.1B
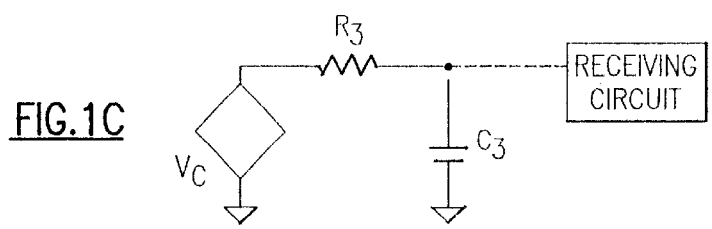
FIG.1C
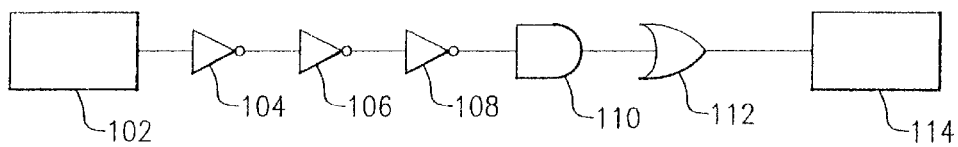
FIG.1D
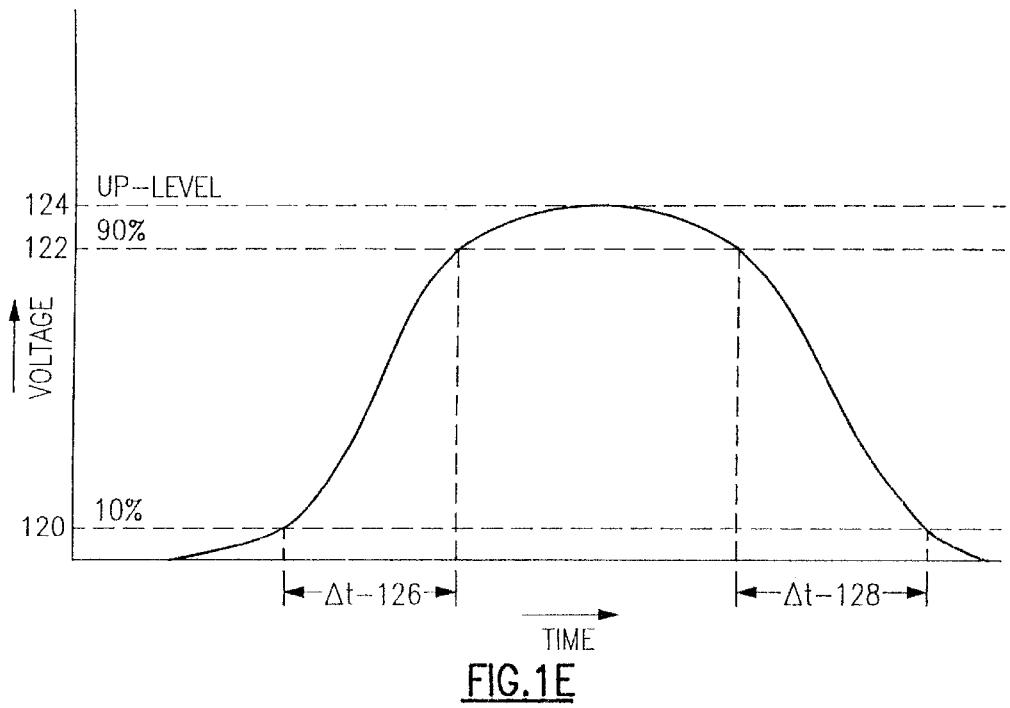
FIG.1E

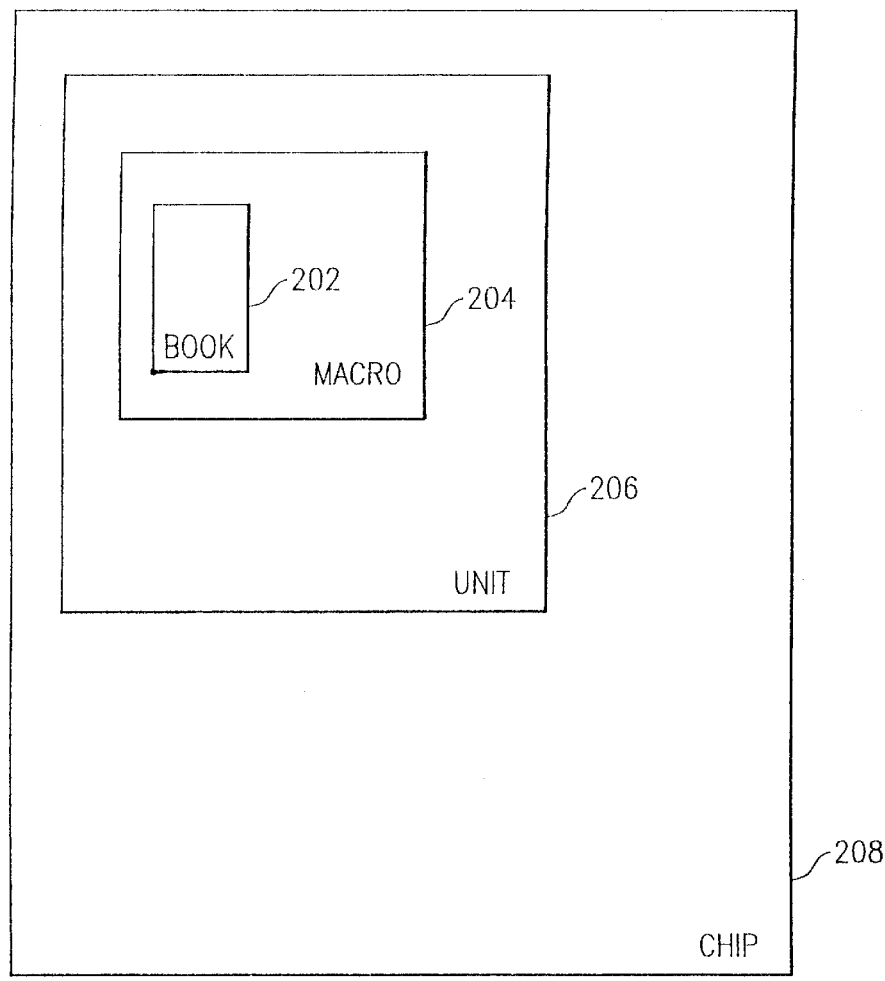

AUTOMATED PROGRAMMABLE PROCESS AND METHOD FOR THE IMPROVEMENT OF ELECTRICAL DIGITAL SIGNAL TRANSITION RATES IN A VLSI DESIGN

FIELD OF THE INVENTION

The following invention relates generally to signal transmission in Very Large Scale Integration/Ultra Large Scale Integration (VLSI/ULSI) systems and specifically to an efficient process for evaluation of electrical digital signal transmission properties and performance optimization in VLSI/ULSI chip design.

TRADEMARKS

S/390 and IBM are registered trademarks of International Business Machines Corporation, Armonk, N.Y., U.S.A. and Lotus is a registered trademark of its subsidiary Lotus Development Corporation, an independent subsidiary of International Business Machines Corporation, Armonk, N.Y. Other names may be registered trademarks or product names of International Business Machines Corporation or other companies.

BACKGROUND

A typical problem in high performance digital circuit implementation is maintaining a sharp signal transition rate (or slew rate). A signal slew rate is defined as the rate of change of voltage at a given point (dv/dt). The signal slew is defined as the time it takes a signal at any given point to transition from one digital state (up or down level) to the opposite digital state (down or up level) respectively. Since the dv/dt of a signal is not constant (is non linear) it is customary to define a signal slew between two fixed voltage points which are within the extreme digital up and down level states, i.e. 10% to 90% points.

A circuit is defined as a collection of transistors arranged in such a way that the output signal is some function 'f' of the one or more input signals (output=f(input)). In a digital circuit the function 'f' is typically a Boolean relationship.

The propagation delay through a digital circuit is defined as the time required to achieve a stable output on the circuit once one or more of the inputs have changed states. The propagation delay is typically measured at some reference voltage point midway between the up and down levels. Some of the factors that affect the propagation delay through a circuit are: the physical geometries of the devices in the circuit, the output load on the circuit and the input signal slew rate.

The physical connection between two or more digital circuits is called a net. The net is typically implemented as one or more conducting wire segments. The driver of the net is the circuit which has its output connected to the net and typically has the capacity to electrically charge and discharge the net thus changing the electrical potential (or voltage). The receiver(s) of the net is the circuit which has one or more of its inputs connected to the net. There are typically one or more receivers on a net.

In a synchronous digital sate machine (semiconductor chip) there are numerous memory elements. The memory elements are also referred to as latches. Each latch is a circuit comprising many transistor devices which are used to store a binary state (high or low value). Synchronous clocks activate the latches at specific frequencies to reevaluate to new states. The state changes are a function of the Boolean logic circuit and net connections that are implemented between latches. The performance of the chip is measured as the propagation delay through a path of circuits and nets from one latch to a receiving latch. The slack on a given net can be derived from the propagation delay and required arrival time (to support a specific clock frequency). A positive slack indicates that the propagation delay through a path is smaller than the inverse of the clock frequency and there is some delay margin. A negative slack indicates that propagation delay through a path is larger than the inverse of the clock frequency and the system will not operate properly as a synchronous digital state machine since the wrong state may be captured.

A poor signal slew rate has several detrimental effects which impact the overall performance and electrical integrity of the digital circuit. The performance of a digital circuit is degraded by a poor signal slew rate in several ways: the propagation delay of a signal with poor slew rate is increased and the propagation delay of the next stage in the circuit is also degraded by the slower switching rate at the input. The electrical integrity of the circuit is adversely effected since a poor slew rate at the input of a circuit is more susceptible to being effected by electrical noise which can come in the form of coupled line (or wire) noise or power supply noise.

What is required is a method for determining the factors which cause poor signal slew rates for each net on the chip and a method for determining what the best solution for improving the slew rate for each failing net is. Moreover, what is required is a way to automate the process and providing key information regarding the pertinent net characteristics and solution required to the chip designer and/or VLSI design system.

The invention solves the problem of exploring the tradeoffs of the solution space outlined above in an automated fashion and feeds back the solutions to the chip designer and VLSI design system.

SUMMARY OF THE INVENTION

The present invention is directed to a method, and a system for using the method, for automating a slew rate analysis between two or more functional elements on a semiconductor chip. The method includes the steps of: receiving as input one or more input parameters characterizing signals transmitted between the functional elements; and transmitting as output one or more output parameters characterizing the slew rates; and one or more output parameters characterizing a solution for slew rates not meeting a design target.

The receiving step can comprise any one of: providing a hierarchical signal name cross-reference defining a name for the signal for a given hierarchy level of the functional elements; providing a set of one or more boolean equations used to generate the one or more output parameters from the one or more input parameters; providing a physical design information for the functional elements; and providing a timing information for the signals.

The boolean equations permit a user to define the manner in which the transmitting step is performed. The boolean equations can include as input variables: the physical design information for the functional elements; and the timing information for the signals.

The step of providing physical design information for the functional elements includes any one of: determining the number of receiving circuits for the signal; determining the total length of all wires comprising the signal; determining the number of bits comprising the signal, if the signal comprises a bit in a communication bus; and determining the ratio of a first minimum distance through which the signal passes, wherein the first minimum distance includes intermediate pins through one or more of the functional elements, to a second minimum distance through which the signal passes, wherein the second distance lacks the intermediate pins.

The step of providing timing information for a signal comprises any one of: determining a slew for the signal at the driving end (near end); determining a slew for the signal at each receiving end (far end); determining a delay slack for the signal; determining an effective capacitance value for the signal as seen by the circuit driving the signal; determining an effective resistance value for the signal as seen by the circuit driving the signal; determining a total gate capacitance value of all circuits receiving the signal; and determining one or more parameters of a reduced standard parasitic format (RSPF) design tool.

The step of determining one or more parameters of an RSPF design tool comprises any one of: determining a second resistance value for the tool; determining a first capacitance value for the tool; determining a second capacitance value for the tool; and determining a third capacitance value for the tool.

FIGS. 1A–1C illustrate how RSPF models a wire. FIG. 1A illustrates a wire disposed between a driving circuit and a receiving circuit. FIG. 1B illustrates the model of this wire, as a pair of resistors R1, R2, a pair of capacitors C1 (with voltage drop Vc), C2, driven by the driving circuit. FIG. 1C illustrates a normalized version of the model of FIG. 1B, having Vc as a voltage source, resistor R3 normalized to the value of 1, an effective capacitance labeled C3, and the above-noted receiving circuit. Since R3 is normalized to 1, the "RC" time constant for the circuit is equivalent to R3C3, which is equivalent to C3.

The transmitting step can include the steps of: determining if a signal requires one or more buffers; determining if signal pin locations of the functional elements through hierarchical levels thereof are not optimal; determining if strengths of the circuit driving the signal must be increased; determining if the widths of wires used to transmit the signal must be increased; and determining if wires used to transmit the signal must be on less resistive wiring layers.

BRIEF DESCRIPTION OF THE DRAWINGS

The foregoing and other features and advantages of the invention will be described with reference to the accompanying drawings. In the drawings, like reference numbers generally indicate identical, functionally similar, and/or structurally similar elements.

FIGS. 1A, 1B, 1C illustrate how a reduced standard parasitic format (RSPF) tool models a wire.

FIG. 1D illustrates an example of the connections between a first latch and a second latch on a chip;

FIG. 1E illustrates the slew rate by showing the relationship between voltage and time;

FIG. 2 is a symbolic illustration of a possible hierarchy for a VLSI design;

FIG. 3 is a symbolic illustration of how macros are placed in a unit;

DETAILED DESCRIPTION OF THE INVENTION

Figure 4:
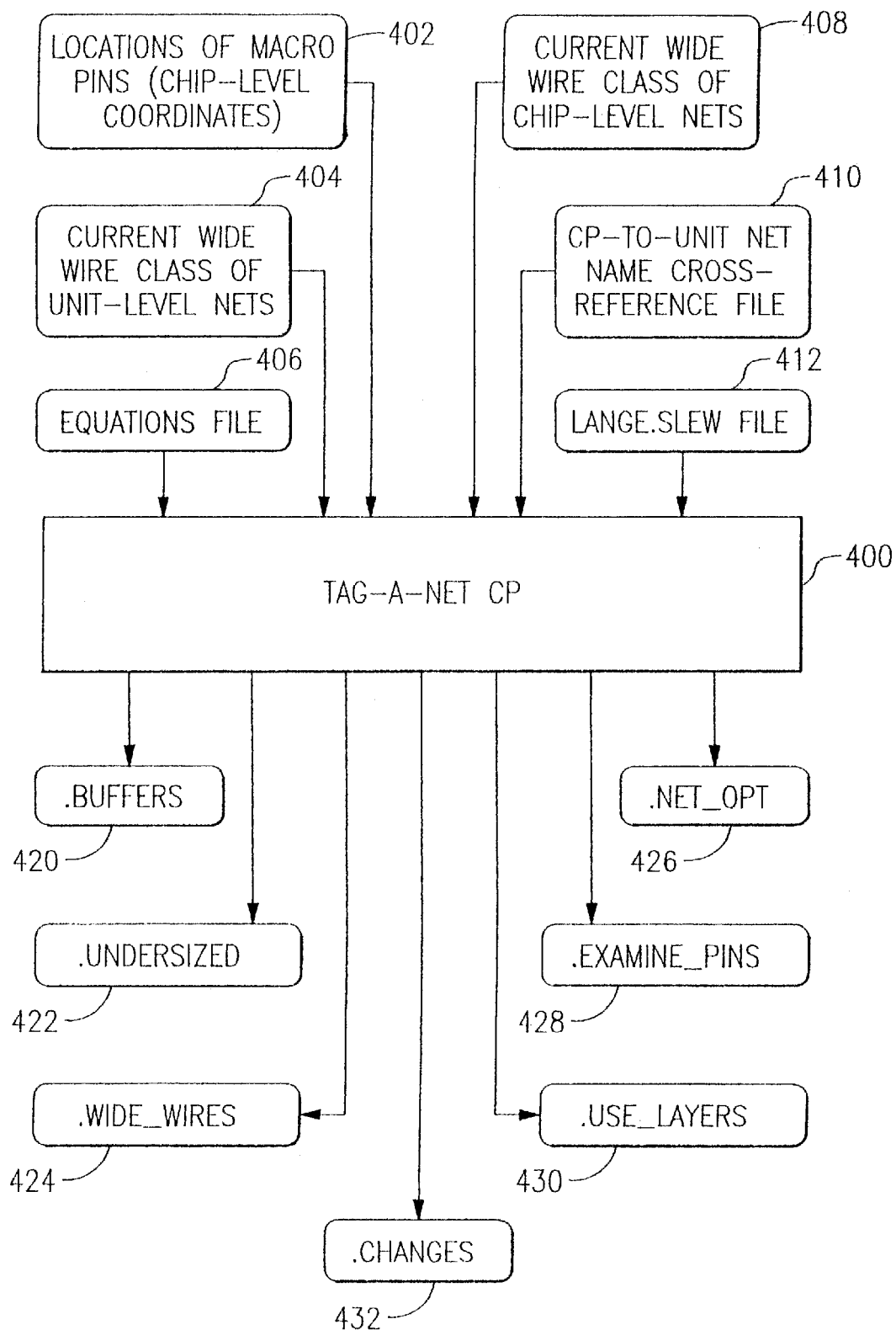
FIG. 4 illustrates the respective inputs and outputs to the inventive automated programmable electrical digital signal transition rates tool.

In the following description of the preferred embodiments, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

The present invention enables a user to explore the tradeoffs of the solution space for poor digital signal transmission rates in a VLSI design. Specifically, these are slew rates and propagation delays for the semiconductor chip.

The solutions explored include (1) reducing the overall interconnect length of a wire over which the signal propagates by optimizing the floorplanning data such as positions of sub-component interconnect pins at each level of the design hierarchy; (2) increasing the drive strength of the circuit which is driving the signal; (3) providing one or more buffers (or repeaters) along the interconnect wire or wires to allow re-powering of the electrical signals, which in effect increases the slew rate and reduces the switching time; (4) reducing the resistance of the interconnect wiring by increasing the width of the wire; (5) reducing the resistance of the interconnect wiring by using a wiring layer which has a smaller resistance per unit length; (6) implementing a combination of any of the above options.

The present invention solves the above problems by automatically permitting the user to explore tradeoffs of the solution space. The solution space is defined for the user automatically, and fed back to the semiconductor circuit design system. This will become apparent from the detailed description below.

FIG. 1D can be used to illustrate the problems associated with these limitations. FIG. 1D illustrates the connections between a first latch and a second latch on a chip. FIG. 1D includes latch 102, inverters 104, 106, 108, AND gate 110, OR gate 112, and latch 114.

Each element between a pair of latches is referred to as a stage. Therefore, FIG. 1D illustrates a five-stage path. As noted, three of the five stages are inverters 104, 106 and 108.

In a single clock cycle, the voltage of latch 102 is transmitted to latch 114. The longest time it takes for a signal to be transmitted from a first latch, for example latch 102, to a second latch, for example latch 114, of all the time periods it takes for a signal to be transmitted between any two latches on the chip, defines the clock cycle of the microprocessor.

The slew rate is best understood by viewing an exemplary driving circuit and an exemplary receiving circuit on the chip. For a signal transmitted from inverter 106 to inverter 108, inverter 106 is the driving circuit and inverter 108 is the receiving circuit.

The slew rate is determined by the capacitance viewed by the driving circuit, namely inverter 106. Inverter 106 views a total capacitance (or "load") determined by the capacitance of the wire between inverter 106 and inverter 108, and the capacitance of the gates of inverter 108.

FIG. 1E illustrates the slew rate by showing the relationship between time and voltage across a transistor. The slew rate is defined as the change in voltage divided by (or per) change in time. On the ordinate axis, FIG. 1E includes a 10% of up level voltage 120, a 90% of up voltage 122, and an up (high) voltage 124. On the abscissa axis, FIG. 1E includes delta-t region of rising slew 126, and delta-t region of falling slew 128. Region 126 is the time it takes to go from the 10% of up level voltage to the 90% of up level voltage. Region 128 is the time it takes to go from the 90% of up level voltage to the 10% of up level voltage.

It is important that the signal voltage level at a latch input or any other microprocessor element be stable when the receiving circuit is sampling the signal. Suppose it takes 1.7 microseconds for OR gate 112 to transition from a low voltage to a high voltage. Because of a low slew rate caused by noise, it is possible that it takes 1.5 milliseconds for the signal transition.

If because of the noise, the signal is not high enough for latch 114 to sample a high (or low) value, but instead samples a low (or high) value, respectively, the result is a misread signal. The faster and sharper the slew rate, the less the effects of noise degrading the signal.

In order to increase the slew rate, it is possible to increase the size of the transistor making up inverter 106. However, an increase in the size of this transistor deleteriously impacts the slew rate of the signal between inverter 104 and inverter 106.

The reason for this fact is that while inverter 106 acts as a driving transistor for a signal propagating to inverter 108, inverter 106 is also a receiving circuit for the signal propagating from inverter 104, when inverter 104 acts as a driving circuit.

An increase in the size of the transistors of inventer 106 improves the signal slew rate from inverter 106 to inverter 108, but degrades the signal slew rate from inverter 104 to inverter 108, because it also increases the amount of capacitance associated with the gate of this transistor viewed by inverter 104 when it drives a signal to receiving inverter 106. Consequently, any physical change made to a transistor to increase the signal slew rate impacts all the previous circuits in the same latch-to-latch path.

It is also possible to increase the slew rate without impacting the size of the transistors. This is possible by making the load, or the capacitance that the driving circuit sees, smaller. To increase the slew rate between the driving transistors of inverter 106 and the receiving transistors of inverter 108, (1) the wire load, or the load on the wire between the transistors, can be reduced, and (2) the device load, or the load of the gate of transistor 108, can be reduced. The wire load and the device load are additive.

If the interconnect wires (between the stages or circuit devices) are relatively long, the wire load and device load can hurt the slew rate. A buffer can be used to regenerate the signal, and prevent poor signal transition.

In one embodiment, a buffer consists of two inverters connected in succession. The buffers, which can also be called a repeater, can be provided along the length of the interconnect wire to repower the signal and increase the slew rate. A pair of inverters can form a single buffer, because their additive effect is to invert the signal, and re-invert it back to the original signal, which permits amplification of the signal for a relatively long distance on the chip, without dissipating the signal.

Suppose there were a direct connection between inverter 104 and AND gate 110, without inverters 104 and 106 as intermediaries. If the length of the interconnect wire between these two stages were long, causing a poor slew rate, then inverters like inverters 106 and 108 could be added together (as a single buffer), to increase the slew rate.

FIG. 2 is a symbolic illustration of how a chip is assembled. FIG. 2 comprises a chip 208. Chip 208 comprises a number of units 206. Units 206, in turn, comprise a number of macros 204. Macro 204 comprises a number of books 202. These different components are connected together by wire lengths, which are called nets. A net comprises all the wires that connect the pins of a component together from the same signal.

Book 202 is an individual circuit element, such as an adder, a multiplier, a divider, an AND gate, an OR gate, a shifter, or a comparison circuit. Macro 204 is a collection of books, working together for a common function. For example, there can be a floating point addition macro which performs floating point additions. Unit 206 is a compilation of macros, performing a similar function together. For example, unit 206 can be a floating point unit, which comprises a floating point addition macro, a floating point subtraction macro, a floating point multiplication macro, and a floating point division macro. The units together form the chip 208.

FIG. 3 is a symbolic illustration of how macros are placed on a unit 300. Unit 300 includes macro A 302, macro B 304 and macro C 306.

Each macro includes one or more books. Illustrated are book 308 in macro 302, book 310 in macro 304 and book 312 in macro 306. At each level of the book-macro-unit-chip hierarchy are pins, used to connect these individual units together.

Illustrated are macro 302 pin 314, macro 304 pin 316, macro 306 pin 318. These pins are used to provide a digital connection between any two macros.

Books 308, 310, 312 also have pins. Instead of showing where the pins are actually located, the pins on these books are symbolically illustrated by an "X" drawn in the center of each book.

From book 308 on macro 302 to its pin 314 is a connection 330. Any signal from book 308 directed to a book on another macro must traverse connection 330. From book 310 on macro 304 to its pin 316 is a connection 340. From book 312 on macro 306 to its pin 318 is a connection 350.

Because the macro pins 314, 316, 318 are not optimally located with respect to one another, the distances of the nets between them are relatively long with respect to the size of the unit, and therefore with respect to the size of the chip. For example, a signal from book 308 on macro 302 to book 312 on macro 306 must traverse lengths 321, 323, 324 and 325 of net 320. Similarly, a signal from book 308 on macro 302 to book 310 on macro 304 must traverse lengths 321 and 322 of net 320. Because these lengths are long, the capacitance is larger, and the slew rate between the books are slow. It is desirable to optimize, or decrease, these lengths between books.

FIG. 4 illustrates the respective inputs and outputs to the inventive automated programmable electrical digital signal transition rates tool. The inventive tool is named "Tag-a-Net CP" which is labeled element 400.

FIG. 4 includes inputs: locations of macro pins (chip-level coordinates) 402, current wide wire class of unit-level nets 404, equations file 406, current wide wire class of chip-level nets 408, CP-to-unit net name cross-reference files 410, and lange.slew file 412.

FIG. 4 includes as outputs: .buffers file 420, .undersized file 422, .wide_wires file 424, .changes file 432, .net_opt file 426, .examine_pins file 428, and .use_layers file 430.

Input 402 stores the locations of the macro pins in the illustrated embodiment, with the pins x-y coordinates translated up to the top level of the design hierarchy.

Input 408 specifies the class of the chip-level nets. Each net has a class associated with it, indicating one or more physical characteristics of the net, i.e. the width of the wire for each layer of metal that comprises the net. The metal connections comprising the wires are in different layers. Input 404 specifies the same thing for the unit-level nets.

Input 410 specifies the names of the chip to unit level nets. When the hierarchy levels are switched, the names of the nets can be changed. For that reason, this input provides consistency between hierarchy levels (i.e., this net belongs to which unit).

Input 406 is the equations file and comprises a series of equations used by "Tag-a-Net CP." These equations are used in and described below with respect to FIG. 5.

Input 412 is the lange.slew file, which is a modified output from a timing analysis program. Each net has timing information, and is broken down in a driver-receiver basis. The lange.slew fields are described in detail in Table 1.

TABLE 1

| Field | Description |
|---|---|
| SLEWSLK | This parameter is the slew slack. The slew slack is determined from the target slew rate minus the Einstimer slew rate. The target slew rate is defined below, labeled "Target." The Einstimer rate is the measured slew rate, labeled "CSLEW" below. |
| Target | This parameter is the target slew slack, which is the goal for the total slack. For critical nets, it is set as a default as 320 picoseconds (ps) + slack rate. For all other nets, it is defined as the minimum of (320 ps + slack) and 480 ps. (For the case of 320 ps + slack, the target is desired to be the slack plus an inherent slew of 320 ps.) |
| Net Name | This parameter is the name given to the net. |
| SLEW | This parameter is a parameter that can be used as a sanity check for determining CSLEW. A program is used to determine the slew at the output of the driver and feed it to a capacitor whose value is that of C3 (refer to FIGS. 1A–1C). The SLEW is the time it takes for the voltage to go from 10% to 90% of the full voltage. |
| CSLEW | This parameter is the measured slew rate, called the Einstimer slew. |
| C3 | Before the timing program is run, the RSPF (reduced standard parasitic format) program is run. RSPF is a Cadence program (provided by Cadence Design Systems) that analyzes the wire, by breaking it up into smaller resistors and capacitors. C3 is the capacitance of a pi model representation of a net, as defined below. In RSPF, the net is represented as a voltage driver driving a circuit, which includes resistors R1, R2, and capacitors C1, C2. This configuration can be represented as a voltage controlled voltage source driving a normalized resistor (R3) and a capacitor (C3). (Refer to FIGS. 1A–1C). The C3 value is the most telling value of the RSPF. A large C3 value (e.g., greater than 220) denotes a wide wire should be used, or that the net should be broken up with a repeater. |
| NSLEW | This parameter is the near-end slew. It includes some model of the resistive and capacitive loading of the net as seen by the driver. NSLEW is calculated at the driver output. If this number is big (e.g., greater than 150), it may be desirable to increase the strength of the driving transistors, meaning the current circuit is too weak. |
| Ceff | This parameter is the effective capacitance as seen by the driver on the load the driver is driving. |

TABLE 1-continued

| Field | Description |
|---|---|
| Reff | This parameter is the effective resistance as seen by the driver on the load the driver is driving. The value is typically in 10s of ohms. If it is > 10, the user should consider using a bigger driver. |
| R2 | This parameter is the R2 resistor of for RSPF. (See the definition of C3.) |
| C1, C2 | These parameters are the C1, C2 capacitances for RSPF. (See the definition of C3.) |
| Cpin | This parameter is the input capacitance of the receiver (the circuit receiving the signal from the driving circuit in the given driver-receiver pair.) It is a way of telling whether the load is dominated by the macro pin capacitance. |
| Cpin_tot | This parameter is the total input capacitance of all receivers, or the total pin capactance. It is a way of telling whether the load is dominated by macro pin capacitance. |
| SLACK | This parameter is the delay slack of the receiver, from the driving transistor to the receiving transistor. |
| RATIO | This is the ratio of the Manhattan wire length as calculated with intermediate-level(s)-of-hierarchy pins considered versus the Manhattan wire length as calculated without considering the intermediate-level(s)-of-hierarchy pins. The Manhattan length is defined below. A high ratio denotes bad unit pin placement. (The wire length defined herein is the macro to macro Manhattan distance. This is not a routed length.) |
| RLNGTH | This parameter is the Manhattan length of the net (unconstrained distance, or the distance without any pins) from the driver to the receiver. The Manhattan length is the length between two points using only vertical and horizontal points between the two points. |
| REC | This parameter is the number of macros receiving the present signal, or the number of receivers for a given net. |
| BUSS | This parameter is the number of bits if the given signal is a member of a bus. |

Referring back to FIG. 4, output files are generated for each functional unit, including: .buffers file 420, .undersized file 422, .wide_wires file 424, .changes file 432, .net_opt file 426, .examine_pins file 428, and .use_layers file 430. Each functional unit will have its own set of files.

In the embodiment described herein, calculations are performed for the unit level (the hierarchical level above the macro level). However, it the present invention works at any hierarchical level desirable by the user. The hierarchies were described above as (1) book, (2) macro (including multiple books and connecting the books together), (3) unit (containing multiple macros and connecting the macros together), (4) chip (containing multiple units and connecting the units together). In addition, there are chip-to-chip pins as well, making for a fifth hierarchical level.

The buffers file 420 lists the nets for which the wire length is too large, and a buffer is required. The .undersized file 422 lists the nets for which the driving transistors are too small, i.e., too weak. The .wide_wires file 424 lists the nets which required wider wires and the recommendation as to which wide wire class these nets should fall into. The .net_opt file 426 is the default for nets that are too complicated for the tool to handle, and must be viewed manually. The .examine_pins file 428 lists the nets which have improperly placed unit level pins, by looking at the RATIO field (see Table 1). The .use_layers file 430 lists the nets which should use specific layers of metal, to decrease wiring resistance. The .changes file 432 lists the nets which are recommended to be changed.

Figure 5:
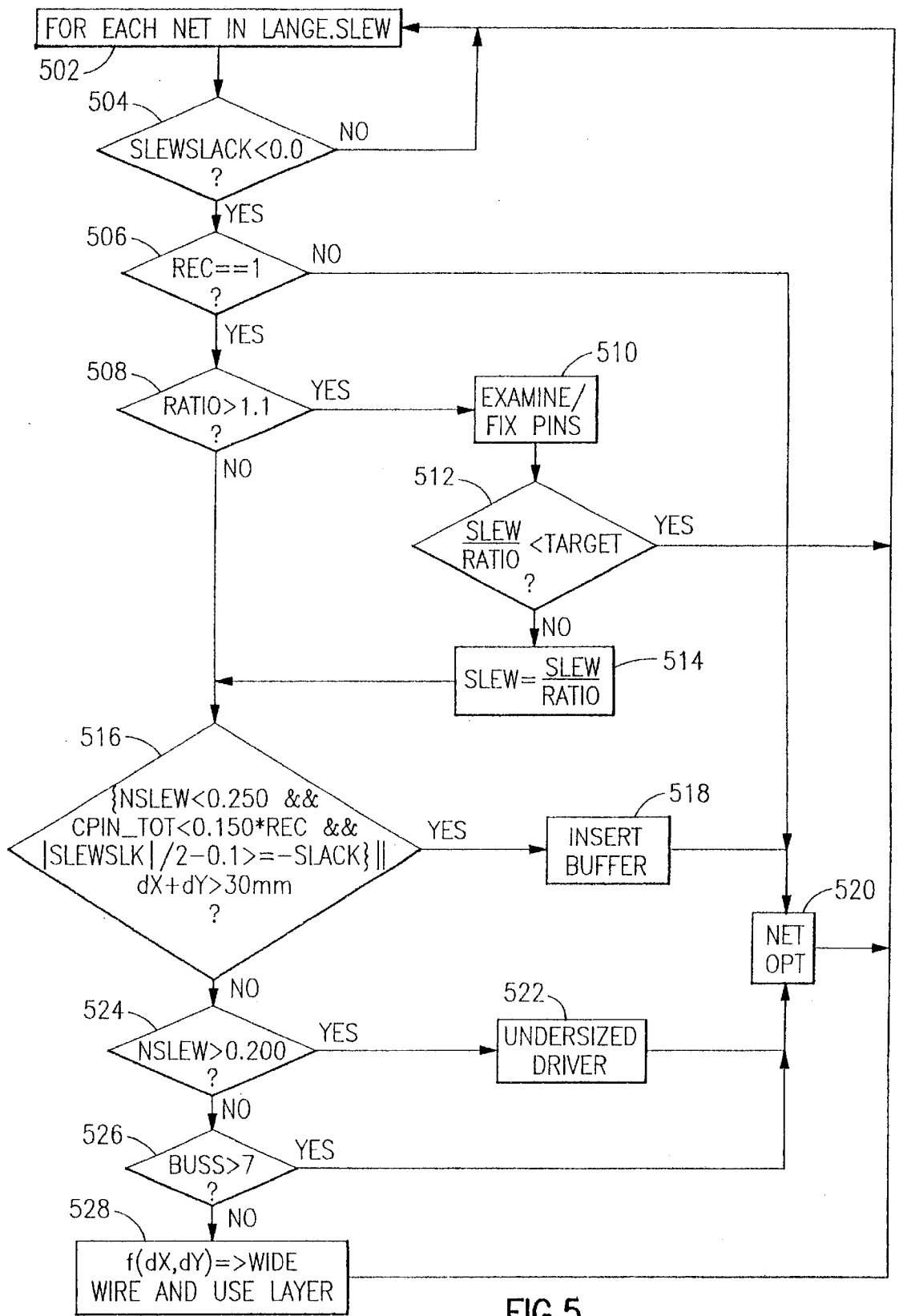
FIG. 5 is a flow chart illustrating one possible implementation of the invention.

FIG. 5 is a flow chart illustrating the invention, which is defined by a set of boolean equations used therein. The flow chart is performed for each net in the lange.slew file in step 502.

In step 504, the lowest SLEWSLACK is observed of all of the SLEWSLACK values (with one value for each receiver in a given net). If the SLEWSLACK is positive, it is acceptable, and the next net is observed by returning to step 502.

If in step 504 the SLEWSLACK is negative, then control passes to step 506. In step 506, it is determined whether there is a single receiver, meaning there are two macros (one driving and one receiving). If this is true, control passes to step 508. If this is not true, meaning multiple receivers exist, the presently described code does not analyze the net, and control passes to step 520 (the net is placed in the .net_opt file because the net is considered potentially too complicated for the tool to handle, and must be examined manually). After step 520, control passes to step 502, where the next net is observed.

In step 508, it is determined whether the RATIO is greater than 1.1, meaning whether the unit level pins are placed optimally. If this is not the case, the net is placed in the .examine_pins file 428 in step 510. Otherwise, control passes to step 516.

After step 510, it is determined whether the ratio of SLEW to RATIO is less than the target. If the slew was modified to effect good (ratio<1.1) pin placement, in this step it is asked whether the slew is good now. If the slew is good, then control passes back to step 502, to observe the next net, since fixing the poor pin placement will be sufficient to fix the poor slew.

If the slew is not determined to be good in step 512, control passes to step 514, where the SLEW is modified to SLEW/RATIO since it is assumed that fixing the suboptimal pin placement will modify the signal slew by a factor of SLEW/RATIO, and control passes to step 516.

Control passes to step 516 from both steps 508 and 514. Step 516 has a number of conditions.

The first condition is whether the NSLEW is less than 0.250. If NSLEW is less than 0.250, then the driving transistors are assumed to be appropriately sized.

The second condition is whether Cpin_tot<150 picofarads (total pin capacitance is less than 150 picofarads) times the number of receivers. This determines whether the total pin capacitance is 150 picofarads per receiver, indicating if the load as seen by the driver has its majority in wire capacitance versus gate capacitance.

The third condition is whether the absolute value of the slew slack (SLEWSLK), halved (which is the value of the slew slack for a new half length net, after the original net has been divided in two with a buffer), minus a small amount (100 picafarads, used to provide flexibility, because additional gate capacitance and propagation delay is introduced by the addition of the buffer), is greater than or equal to the negative of the slack (ensuring the overall delay slack will be better than before).

In step 516, if all three of the above conditions are met, or the Manhattan length (dX+dY) of the net is greater than 30 millimeters, then a buffer is required to be inserted in step 518. Step 518 is followed by step 520 (the net is placed in the .net_opt file because another tool must be utilized to determine the optimal placement for the buffer, and therefore must be examiner externally), which is followed by step 502, where the next net is observed.

If step 516 is not satisfied, meaning it is not necessary to insert a buffer dividing the net, in step 524 it is determined whether NSLEW is greater than 200, indicating the driver is too weak. The net is placed in the undersized file 422, and control passes to steps 520 and 502, which were described above.

If step 524 is not satisfied (i.e., the driver is performing acceptably), in step 526, it is determined whether the net is part of a bus (parameter BUS) that has greater than 7 bits. If it is a greater the bit bus, then any topological change to the nets of this bus (wider wires, wires on a less resistive layer of metal) has the potential of significantly increasing the required area for those nets in that region of the design). For this reason, if step 526 is satisfied, control passes to step 520 and 502, which were described above.

If step 520 is not satisfied, in step 528 a function based on the x length of the wire and the y length of the wire is used. This function uses the x distance of the Manhattan length of the wire, and the y distance of the Manhattan length of the wire, to determine a "bucket" in which the wire should be placed. This bucket assigns (1) a wide wire class to the net, and (2) a use layer class to the net, which are respectively output to the .wide_wires file 424 and the .use_layers file 430. A specific embodiment of the function is provided in Appendix A. The function comprises code in the Perl programming language. (The reader's attention is drawn to the section of code beginning with "$start, $s01, . . ." and ending with "s11.")

While the invention has been particularly shown and described with reference to preferred embodiments thereof, it will be understood by those skilled in the relevant art that various changes in form and details may be made therein without departing from the spirit and scope of the invention.

What is claimed is:

1. A method for automating a slew rate analysis between two or more circuits in a VLSI design, comprising the steps of:
   receiving as input One or more input parameters characterizing signals transmitted between said circuits, wherein a signal name cross-reference defining a name for said signal for a given level of said circuits is provided; and
   transmitting as output one or more output parameters characterizing said slew rates.

2. The method according to claim 1, wherein said receiving step comprises any one of:
   providing a set of one or more boolean equations used to generate said one or more output parameters from said one or more input parameters;
   providing physical design information for said circuits; and
   providing timing information for said signals.

3. The method according to claim 2, wherein said boolean equations permit a user to define the manner in which said transmitting step is performed.

4. The method according to claim 3, wherein said boolean equations include as input variables:
   said physical design information for said circuits; and
   said timing information for said signals.

5. The method according to claim 2, wherein said step of providing a physical design information for said circuits comprises any one of:
   determining the number of receiving circuits for a said signal;
   determining the total length of all wires comprising a said signal;

determining the number of bits comprising a said signal, if said signal comprises a bit in a communication bus; and determining the ratio of a first minimum distance through which a said signal passes, wherein said first minimum distance includes intermediate pins through one or more of the circuits, to a second minimum distance through which said signal passes, wherein said second distance lacks said intermediate pins.

6. The method according to claim 2, wherein said step of providing a timing information for said signals comprises any one of:

determining a slew rate for a said signal;

determining a delay slack for a said signal;

determining a slew rate for a said signal at a driver output;

determining a slew rate for a said signal at a receiver input;

determining an effective capacitance value for a said signal as seen by a driving circuit driving said signal;

determining an effective resistance value for a said signal as seen by a driving circuit driving said signal;

determining a total gate capacitance value of all circuits receiving a said signal; and determining one or more parameters of a reduced standard parasitic format (RSPF) design tool.

7. The method according to claim 6, wherein said step of determining one or more parameters of an RSPF design tool comprises any one of:

determining a second resistance value for said tool;

determining a first capacitance value for said tool;

determining a second capacitance value for said tool; and determining a third capacitance value for said tool.

8. The method according to claim 1, wherein said transmitting step comprises the steps of:

determining if said signals require one or more buffers;

determining if signal pin locations of said circuits through hierarchical levels thereof are not optimal;

determining if strengths of transistors driving said signals must be increased;

determining if the widths of wires used to transmit said signals must be increased; and determining if wires used to transmit said signals must be on less resistive wiring layers.

9. A system for automating a slew rate analysis between two or more circuits on a semiconductor chip, comprising:

means for receiving as input one or more input parameters characterizing signals transmitted between said circuits, the means for receiving comprising means for providing a hierarchical signal name cross-reference defining a name for said signal for a given hierarchy level of said circuits; and means for transmitting as output one or more output parameters characterizing said slew rates.

10. The system according to claim 9, wherein said receiving means comprises any one of:

means for providing a set of one or more boolean equations used to generate said one or more output parameters from said one or more input parameters;

means for providing physical design information for said circuits; and means for providing a timing information for said signals.

11. The system according to claim 10, wherein said boolean equations permit a user to define the manner in which said one or more parameters are determined.

12. The system according to claim 11, wherein said boolean equations include as input variables:

said physical design information for said circuits; and said timing information for said signals.

13. The system according to claim 10, wherein said means for providing a physical design information for said circuits comprises any one of:

means for determining the number of receiving circuits for a said signal;

means for determining the total length of all wires comprising a said signal;

means for determining the number of bits comprising a said signal, if said signal comprises a bit in a communication bus; and means for determining the ratio of a first minimum distance through which a said signal passes, wherein said first minimum distance includes intermediate pins through one or more of the circuits, to a second minimum distance through which said signal passes, wherein said second distance lacks said intermediate pins.

14. The system according to claim 10, wherein said means for providing a timing information for said signals comprises any one of:

means for determining a slew rate for a said signal;

means for determining a delay slack for a said signal;

determining a slew rate for a said signal at a driver output;

determining a slew rate for a said signal at a receiver input;

means for determining an effective capacitance value for a said signal as seen by a driving circuit driving said signal;

means for determining an effective resistance value for a said signal as seen by a driving circuit driving said signal;

means for determining a total gate capacitance value of all circuits receiving a said signal; and means for determining one or more parameters of a reduced standard parasitic format (RSPF) design tool.

15. The system according to claim 14, wherein said means for determining one or more parameters of an RSPE design tool comprises any one of:

means for determining a second resistance value for said tool;

means for determining a first capacitance value for said tool;

means for determining a second capacitance value for said tool; and means for determining a third capacitance value for said tool.

16. The system according to claim 9, wherein said transmitting means comprises:

means for determining if said signals require one or more buffers;

means for determining if signal pin locations of said circuits through hierarchical levels thereof are not optimal;

means for determining if strengths of transistors driving said signals must be increased;

means for determining if the widths of wires used to transmit said signals must be increased; and means for determining if wires used to transmit said signals must be on less resistive wiring layers.

* * * * *